(12) United States Patent
Shiba (10) Patent No.: US 9,260,017 B2
(45) Date of Patent: Feb. 16, 2016

(54) POWER CONTROL UNIT

(75) Inventor: Kenjiro Shiba, Takahama (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 208 days.

(21) Appl. No.: 14/008,165

(22) PCT Filed: Mar. 31, 2011

(86) PCT No.: PCT/JP2011/058214
§ 371 (c)(1),
(2), (4) Date: Sep. 27, 2013

(87) PCT Pub. No.: WO2012/131977
PCT Pub. Date: Oct. 4, 2012

(65) Prior Publication Data
US 2014/0015314 A1    Jan. 16, 2014

(51) Int. Cl.
| B60L 11/00 | (2006.01) |
| H02M 7/00 | (2006.01) |
| H05K 5/00 | (2006.01) |
| H05K 7/14 | (2006.01) |
| H02M 1/00 | (2007.01) |

(52) U.S. Cl.
CPC .............. *B60L 11/00* (2013.01); *H02M 7/003* (2013.01); *H05K 5/0069* (2013.01); *H05K 7/1432* (2013.01); *H02M 2001/007* (2013.01)

(58) Field of Classification Search
CPC .... H02M 7/003; H05K 5/0069; H05K 7/1432
USPC ......................................................... 307/9.1
See application file for complete search history.

(56) References Cited

U.S. PATENT DOCUMENTS

2010/0175933 A1* 7/2010 Yoshida ...................... 180/65.1

FOREIGN PATENT DOCUMENTS

| JP | 08-66050 | 3/1996 |
| JP | 11-121690 A | 4/1999 |
| JP | 2005-243741 A | 9/2005 |
| JP | 2010-68670 A | 3/2010 |
| JP | 2011-060670 A | 3/2011 |

* cited by examiner

*Primary Examiner* — Rexford Barnie
*Assistant Examiner* — Toan Vu
(74) *Attorney, Agent, or Firm* — Kenyon & Kenyon LLP (57) ABSTRACT

A power control unit is mounted on a vehicle, and controls the electric power for vehicle-running. The power control unit includes: a PCU case having a lid where an opening is formed; a terminal block having a connector retain hole for retaining an interlock connector formed, and arranged at the PCU case, facing the opening; and a substrate stored in the PCU case, and on which an electronic component is mounted. The substrate is arranged at the side opposite to the lid relative to the terminal block, and deviated from the position facing an aperture of the connector retain hole. The power control unit includes a wall provided integrally with the terminal block, and arranged between the substrate and the connector retain hole. By such a configuration, there is provided a power control unit having an intrusion of a foreign object suppressed while aiming to reduce the size and cost.

2 Claims, 10 Drawing Sheets

POWER CONTROL UNIT

CROSS REFERENCE TO RELATED APPLICATION

This is a national phase application based on the PCT International Patent Application No. PCT/JP2011/058214 filed on Mar. 31, 2011, the entire contents of which are incorporated herein by reference.

TECHNICAL FIELD

The present invention generally relates to power control units, more particularly a power control unit mounted on a vehicle such as a hybrid vehicle or electric vehicle for controlling the electric power directed to vehicle-running.

BACKGROUND ART

In association with a conventional power control unit, Japanese Patent Laying-Open No. 8-66050, for example, discloses an inverter device that can have a capacitor readily exchanged, and that can have the number of steps in fabricating and assembling the inverter device reduced, aiming to sufficiently reduce the cost (PTD 1). In the inverter device disclosed in PTD 1, a control circuit terminal cover having a configuration allowing opening/closing to be fixed is provided corresponding to a terminal block of a control substrate. The control circuit terminal cover is attached to an operation panel cover fixed to the control substrate.

Japanese Patent Laying-Open No. 2010-68670 discloses an inverter device aiming to suppress temperature rise of heat generating components to improve the reliability while favorably maintaining the electrical reliability and electrical property of the inverter device (PTD 2). In the inverter device disclosed in PTD 2, an enclosure case projection is provided at the front face side of a terminal block to prevent a foreign object such as a driver from touching the main circuit substrate and/or back side control circuit substrate to prevent breakdown.

Further, Japanese Patent Laying-Open No. 2005-243741 discloses a housing configuration of a drive unit for driving a motor, aiming to reduce the working steps and assembly steps of plates, and facilitating transfer of an attachment leg for fixing the housing to another predetermined position (PTD 3). In the housing configuration disclosed in PTD 3, a grating having a gap preventing intrusion of a person's hand or a foreign object into the unit is provided at the ventilation opening of the ventilation cover.

CITATION LIST

Patent Document

PTD 1: Japanese Patent Laying-Open No. 8-66050
PTD 2: Japanese Patent Laying-Open No. 2010-68670
PTD 3: Japanese Patent Laying-Open No. 2005-243741

SUMMARY OF INVENTION

Technical Problem

In the inverter device disclosed in the aforementioned PTD 1, intrusion of dust and the like into the terminal block is prevented by closing the control circuit terminal cover when the terminal block is not in use. However, provision of such a cover member for the purpose of preventing intrusion of a foreign object will increase the number of components to raise the fabrication cost. There is also the concern of increasing the size of the device due to the requirement of the space to attach the cover member or a fixture member for the cover.

In view of the foregoing, an object of the present invention is to provide a power control unit having an intrusion of a foreign object suppressed while aiming to reduce the size and cost.

Solution to Problem

A power control unit of the present invention is mounted on a vehicle to control the electric power for vehicle-running. The power control unit includes a case body having a top where an opening is formed, a terminal block having a connector retain hole for retaining a connector formed, and arranged at the case body facing the opening, and a substrate stored in the case body, and on which an electronic component is mounted. The substrate is arranged at the side opposite to the top relative to the terminal block, and is deviated from the position facing an aperture of the connector retain hole. The power control unit further includes a wall member provided integrally with a power control unit constituent component. The wall member is arranged between the substrate and the connector retain hole.

According to the power control unit of the above-described configuration, an intrusion of a foreign object towards the substrate can be suppressed since the wall member is located on the path from the connector retain hole to the substrate. Since the wall member is provided integrally with the power control unit constituent element, the power control unit can be reduced in size and cost.

As used herein, a power control unit constituent component is an element constituting the power control unit, provided for a purpose other than the purpose of preventing an intrusion of a foreign object by the wall member.

Preferably, the wall member is provided integrally with the terminal block. According to the power control unit configured as set forth above, the power control unit can be reduced in size and cost since the wall member is provided at the terminal block directed to connection with an electrical circuit.

Further preferably, the wall member extends from the terminal block as far as to a position overlapping with the substrate in the height direction. By a power control unit configured as set forth above, an intrusion of a foreign object towards the substrate can be suppressed more reliably.

Further preferably, the connector is retained at the connector retain hole by being inserted from one direction. The wall member extends from the terminal block, along the inserting direction of the connector. According to a power control unit configured as set forth above, insertion of a connector into the connector retain hole can be implemented readily without interference of the connector and the wall member.

Advantageous Effects of Invention

According to the present invention, there can be provided a power control unit having an intrusion of a foreign object suppressed while aiming to reduce the size and cost.

DESCRIPTION OF EMBODIMENTS

First Embodiment

Figure 1:
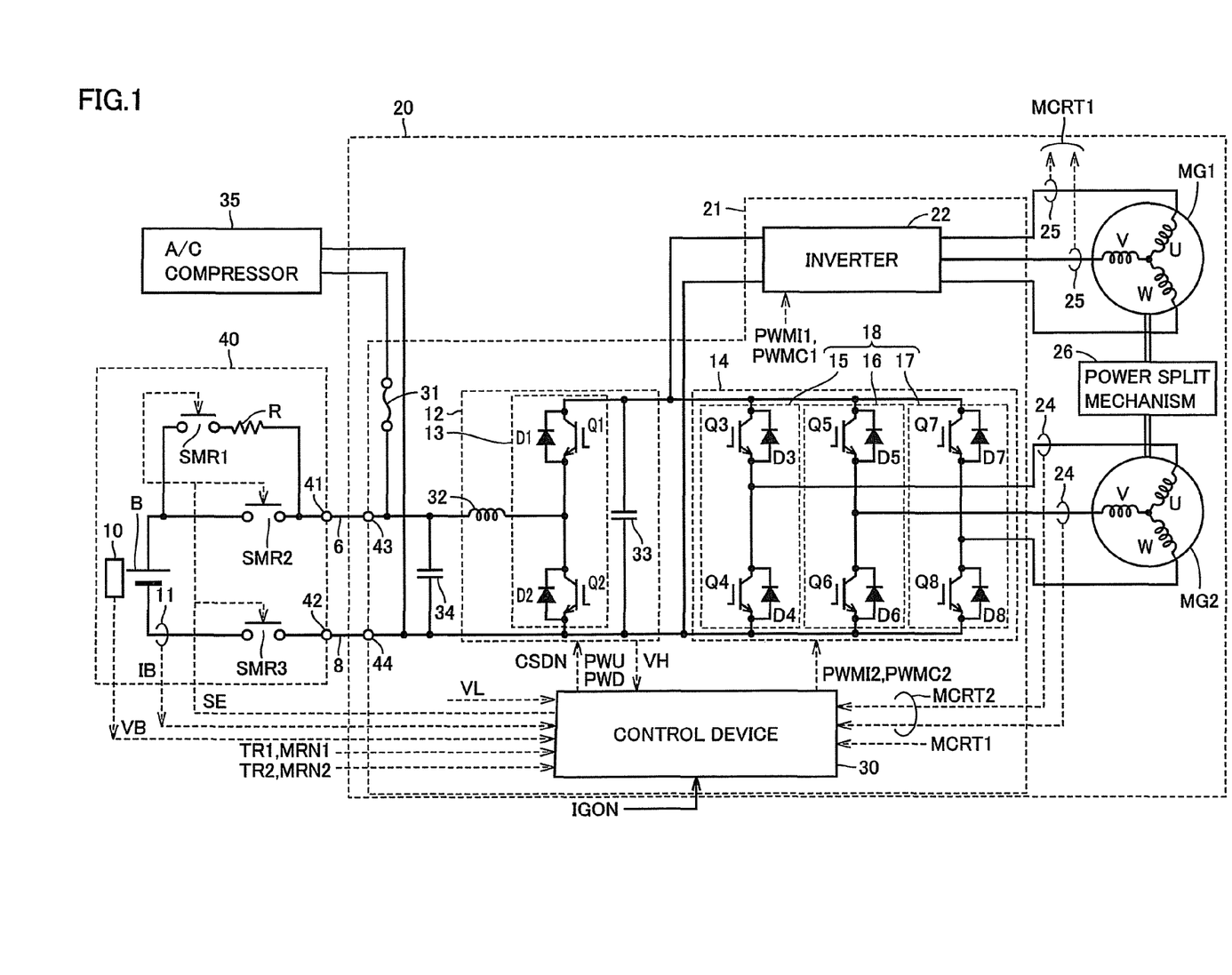
FIG. 1 is a circuit diagram representing a configuration associated with motor generator control of a hybrid vehicle.

FIG. 1 is a circuit diagram representing a configuration associated with motor generator control of a hybrid vehicle. The hybrid vehicle includes an internal combustion engine such as a gasoline engine or diesel engine, and a motor supplied with electric power from a chargeable secondary battery as the power source.

Referring to FIG. 1, the hybrid vehicle includes a battery unit 40, a vehicle driving device 20, and an engine not shown. Vehicle driving device 20 includes motor generators MG1 and MG2, a power split mechanism 26 for distributing the power between the engine not shown and motor generators MG1 and MG2, and a power control unit (PCU) 21 controlling the electric power transferred between battery unit 40 and motor generators MG1 and MG2.

Motor generator MG1 functions mainly as a generator to generate power by the output from the engine. Motor generator MG1 also functions as a starter at the time of starting the engine. Motor generator MG2 functions mainly as a motor, assisting the engine output to increase the driving force. Motor generator MG2 generates power at the time of regenerative braking for charging battery B.

Terminals 41 and 42 are provided at battery unit 40. DC terminals 43 and 44 are provided at PCU 21. The electrical connection between terminal 41 and DC terminal 43 and between terminal 42 and DC terminal 44 is established by cables 6 and 8, respectively.

Battery unit 40 includes a battery B, a system main relay SMR2 connected between the positive electrode of battery B and terminal 41, a system main relay SMR3 connected between the negative electrode of battery B and terminal 42, and also a system main relay SMR1 and a limiting resistor R connected in series between the positive electrode of battery B and terminal 41. System main relays SMR1-SMR3 have the conductive/non-conductive state controlled according to a control signal SE provided from a control device 30 that will be described afterwards.

Battery unit 40 includes a voltage sensor 10 measuring a voltage VB across the terminals of battery B, and a current sensor 11 sensing a current IB flowing through battery B. For battery B, a secondary battery such as of nickel-metal hydride, lithium ions or the like, or a fuel cell may be employed. As a power storage device alternative to battery B, a capacitor of a large capacitance such as an electrical double layer capacitor may be employed.

PCU 21 includes inverters 22 and 14 provided corresponding to motor generators MG1 and MG2, respectively, a boost converter 12 provided common to inverters 22 and 14, and a control device 30.

Boost converter 12 boosts the voltage between DC terminal 43 and DC terminal 44. Boost converter 12 includes a reactor 32 having one end connected to DC terminal 43, a boosting IPM (Intelligent Power Module) 13, and a smoothing capacitor 33. Boosting IPM13 includes IGBT elements Q1 and Q2 connected in series between the output terminals of boost converter 12 providing voltage VH after boosting, and diodes D1 and D2 connected parallel to IGBT elements Q1 and Q2, respectively. Smoothing capacitor 33 is provided between boost converter 12 and inverters 22, 14. Smoothing capacitor 33 suppresses variation of the voltage and current at the side of inverters 22 and 14 corresponding to the high voltage side.

PCU 21 includes a smoothing capacitor 34 provided between battery B and boost converter 12. Smoothing capacitor 34 suppresses variation of the voltage and current at the side of battery B corresponding to the low voltage side.

Reactor 32 has the other end connected to the emitter of IGBT element Q1 and the collector of IGBT element Q2. Diode D1 has its cathode connected to the collector of IGBT element Q1 and its anode connected to the emitter of IGBT element Q1. Diode D2 has its cathode connected to the collector of IGBT element Q2 and its anode connected to the emitter of IGBT element Q2.

The hybrid vehicle includes an A/C (air conditioner) compressor 35. A/C compressor 35 is connected between the input lines of boost converter 12 such that electric power is supplied from battery B.

Inverter 14 converts DC voltage output from boost converter 12 into 3-phase alternating current for output to motor generator MG2 driving the wheel. Inverter 14 returns the electric power generated at motor generator MG2 to boost converter 12 in association with regenerative braking. At this stage, boost converter 12 is controlled by control device 30 so as to operate as a down-converting circuit.

Inverter 14 includes a U-phase arm 15, a V-phase arm 16, and a W-phase arm 17 constituting a traction IPM 18. U-phase arm 15, V-phase arm 16 and W-phase arm 17 are connected in parallel between the output lines of boost converter 12.

U-phase arm 15 includes IGBT elements Q3 and Q4 connected in series, and diodes D3 and D4 connected parallel to IGBT elements Q3 and Q4, respectively. Diode D3 has its cathode and its anode connected to the collector and the emitter, respectively, of IGBT element Q3. Diode D4 has its cathode and its anode connected to the collector and emitter, respectively, of IGBT element Q4.

V-phase arm 16 includes IGBT elements Q5 and Q6 connected in series, and diodes D5 and D6 connected parallel to IGBT elements Q5 and Q6, respectively. Diode D5 has its cathode and its anode connected to the collector and the emitter, respectively, of IGBT element Q5. Diode D6 has its cathode and its anode connected to the collector and the emitter, respectively, of IGBT element Q6.

W-phase arm 17 includes IGBT elements Q7 and Q8 connected in series, and diodes D7 and D8 connected parallel to IGBT elements Q7 and Q8, respectively. Diode D7 has its cathode and its anode connected to the collector and the emitter, respectively, of IGBT element Q7. Diode D8 has its cathode and its anode connected to the collector and the emitter, respectively, of IGBT element Q8.

The intermediate point of each phase arm is connected to each phase end of each phase coil of motor generator MG2. In other words, motor generator MG2 is a 3-phase permanent magnet type synchronous motor. Each one end of the three coils of the U, V and W phases is connected in common to the intermediate point. The U-phase coil has the other end connected to the connection node of IGBT elements Q3 and Q4. The V-phase coil has the other end connected to the connection node of IGBT elements Q5 and Q6. The W-phase coil has the other end connected to the connection node of IGBT elements Q7 and Q8.

Current sensor 25 detects the current flowing through motor generator MG1 as a motor current value MCRT 1. Motor current value MCRT 1 is output to control device 30. Current sensor 24 detects the current flowing through motor generator MG2 as a motor current value MCRT 2. Motor current value MCRT 2 is output to control device 30.

Inverter 22 is connected parallel to inverter 14 relative to boost converter 12. Inverter 22 converts the DC voltage output from boost converter 12 into a 3-phase alternating current for output to motor generator MG1. Inverter 22 receives the boosted voltage from boost converter 12 for driving motor generator MG1 in order to start the engine, for example.

Inverter 22 returns to boost converter 12 the electric power generated at motor generator MG1 by the rotary torque transmitted from the crankshaft of the engine. At this stage, boost converter 12 is under control of control device 30 so as to operate as a down-converting circuit. Since the configuration in inverter 22 is similar to that of inverter 14, detailed description thereof will not be repeated.

Control device 30 receives torque command values TR1 and TR2, motor revolution speeds MRN1, MRN2, various values of voltages VB, VL, VH and current IB, motor current values MCRT 1 and MCRT 2, and an activation signal IGON.

As used herein, torque command value TR1, motor revolution speed MRN1 and motor current value MCRT 1 relate to motor generator MG1, whereas torque command value TR2, motor revolution speed MRN2 and motor current value MCRT 2 relate to motor generator MG2. Voltage VB corresponds to a voltage of battery B. Current IB corresponds to the flow in battery B. Voltage VL is the voltage prior to boosting by boost converter 12. Voltage VH is the voltage after boosting by boost converter 12.

Control device 30 outputs to boost converter 12 a control signal PWU designating boosting, a control signal PWD designating down-conversion, and a signal CSDN designating prohibition of an operation.

Control device 30 outputs to inverter 14 a drive instruction PWMI2 for converting DC voltage output from boost converter 12 into AC voltage directed to driving motor generator MG2, and a regeneration instruction PWMC2 for converting the AC voltage generated at motor generator MG2 into DC voltage to be returned towards boost converter 12. Control device 30 outputs to inverter 22 a drive instruction PWMI 1 for converting DC voltage into AC voltage directed to driving motor generator MG1, and a regeneration instruction PWMC 1 for converting AC voltage generated at motor generator MG1 into DC voltage to be returned towards boost converter 12.

Figure 2:
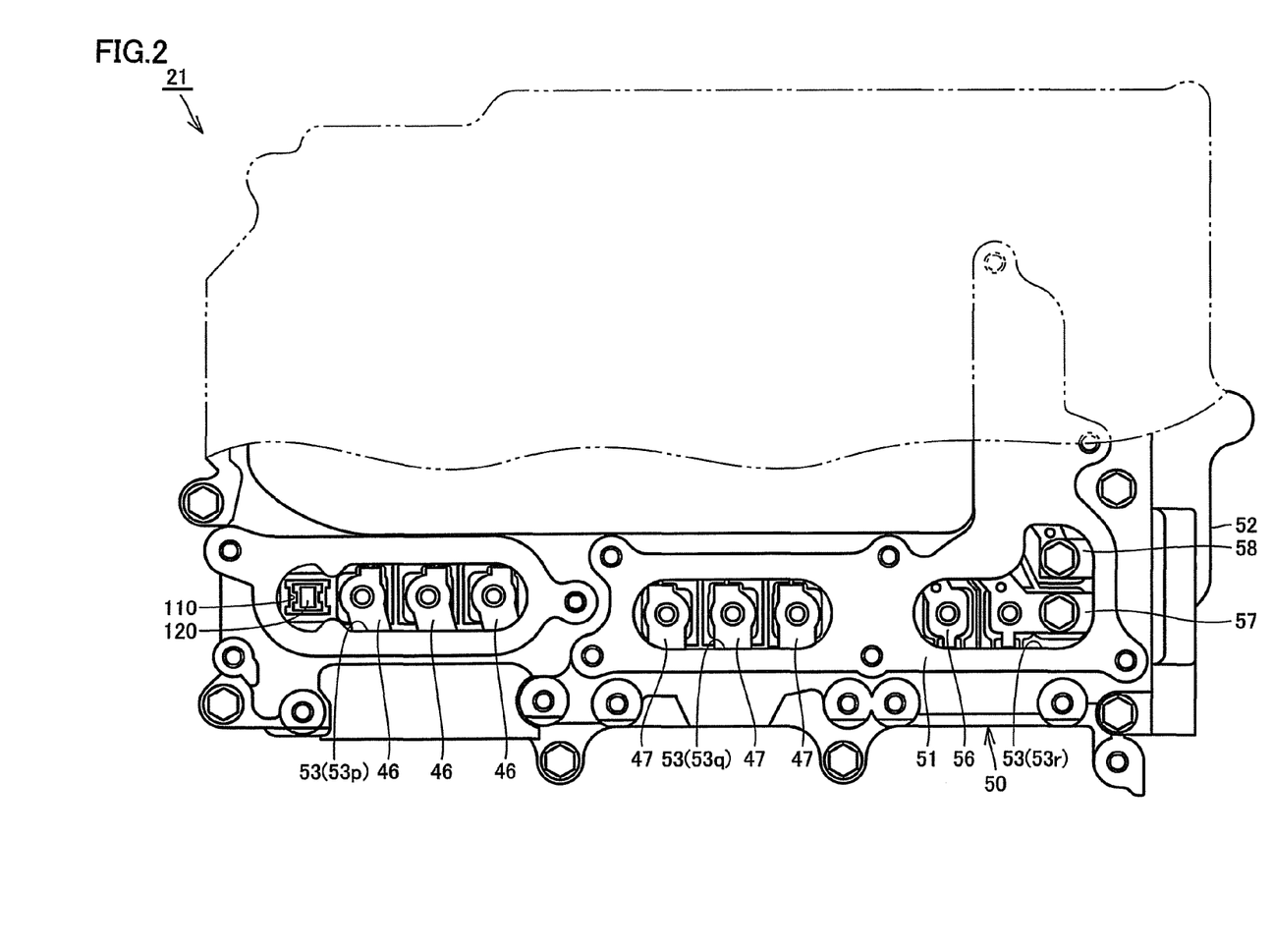
FIG. 2 is a top view of a power control unit shown in FIG. 1.

A configuration of power control unit 21 shown in FIG. 1 will be described hereinafter. FIG. 2 is a top view of the power control unit shown in FIG. 1.

Referring to FIG. 2, power control unit 21 includes a PCU case 50. PCU case 50 corresponds to the outer appearance of power control unit 21. PCU case 50 is made of metal such as aluminium.

PCU case 50 includes a case main body 52 and a lid 51. Case main body 52 takes the shape of a case body that opens upwards. Lid 51 is attached to case main body 52 so as to cover the opening of case main body 52. Lid 51 constitutes one side face of PCU case 50 located at the vertically upper side.

Openings 53p, 53q and 53r (hereinafter, referred to as opening 53 when discrimination therebetween is not particularly required) are formed at lid 51. Openings 53p, 53q and 53r are formed spaced apart from each other. Opening 53 is formed to provide communication between the outer side and inner side of PCU case 50. Opening 53 penetrates lid 51 in the vertical direction from the outer side of PCU case 50 to arrive at the inner side of PCU case 50.

Figure 3:
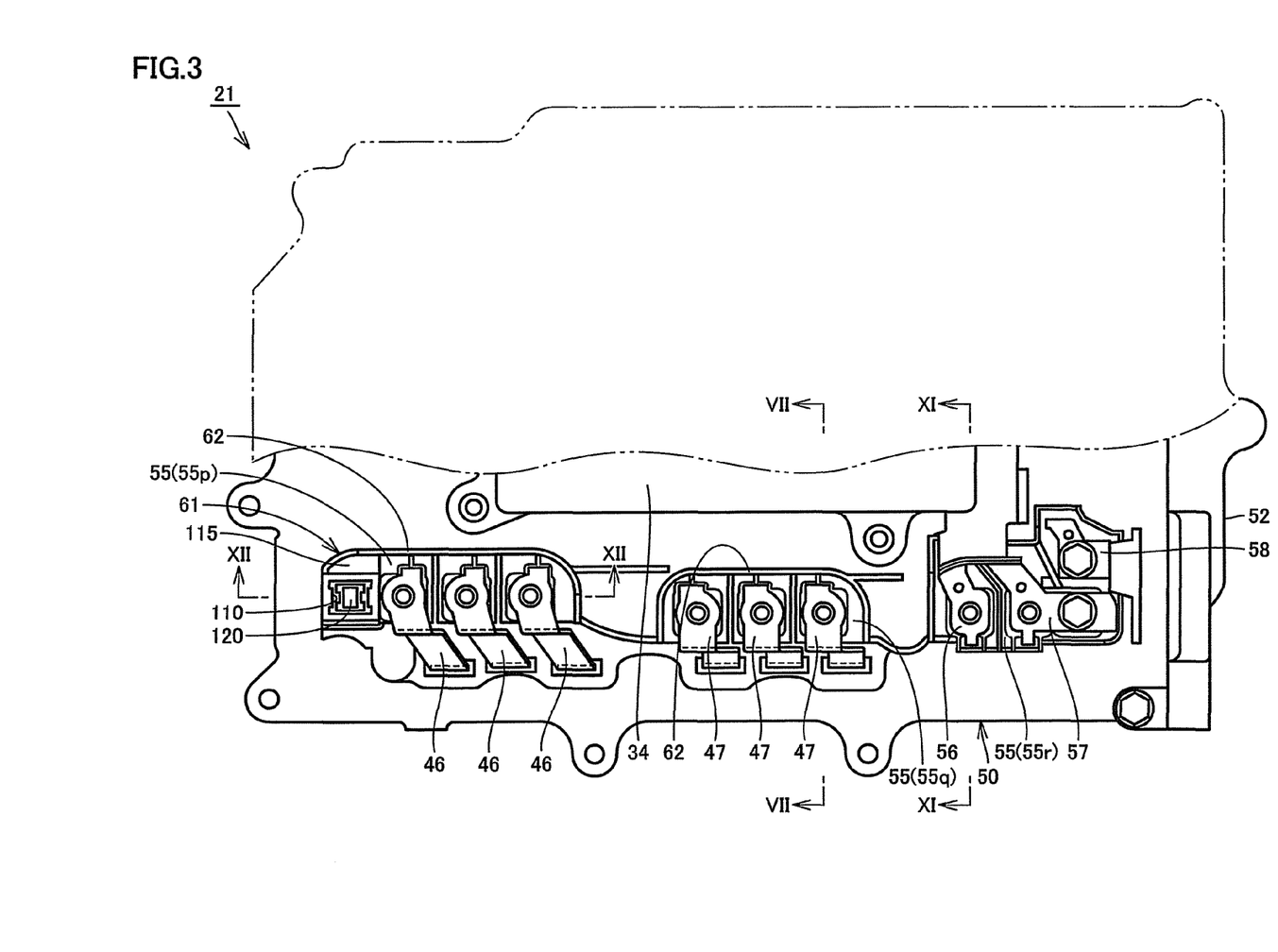
FIG. 3 is a top view of the power control unit shown in FIG. 1 with the lid removed.

FIG. 3 is a top view of the power control unit of FIG. 1 in a state having the lid removed. Referring to FIGS. 2 and 3, power control unit 21 further includes a terminal block 61. Terminal block 61 is stored in PCU case 50. Terminal block 61 is arranged at the back side of lid 51. Terminal block 61 is located adjacent to lid 51 inside PCU case 50. Terminal block 61 is arranged at a position facing opening 53 formed at lid 51.

Figure 4:
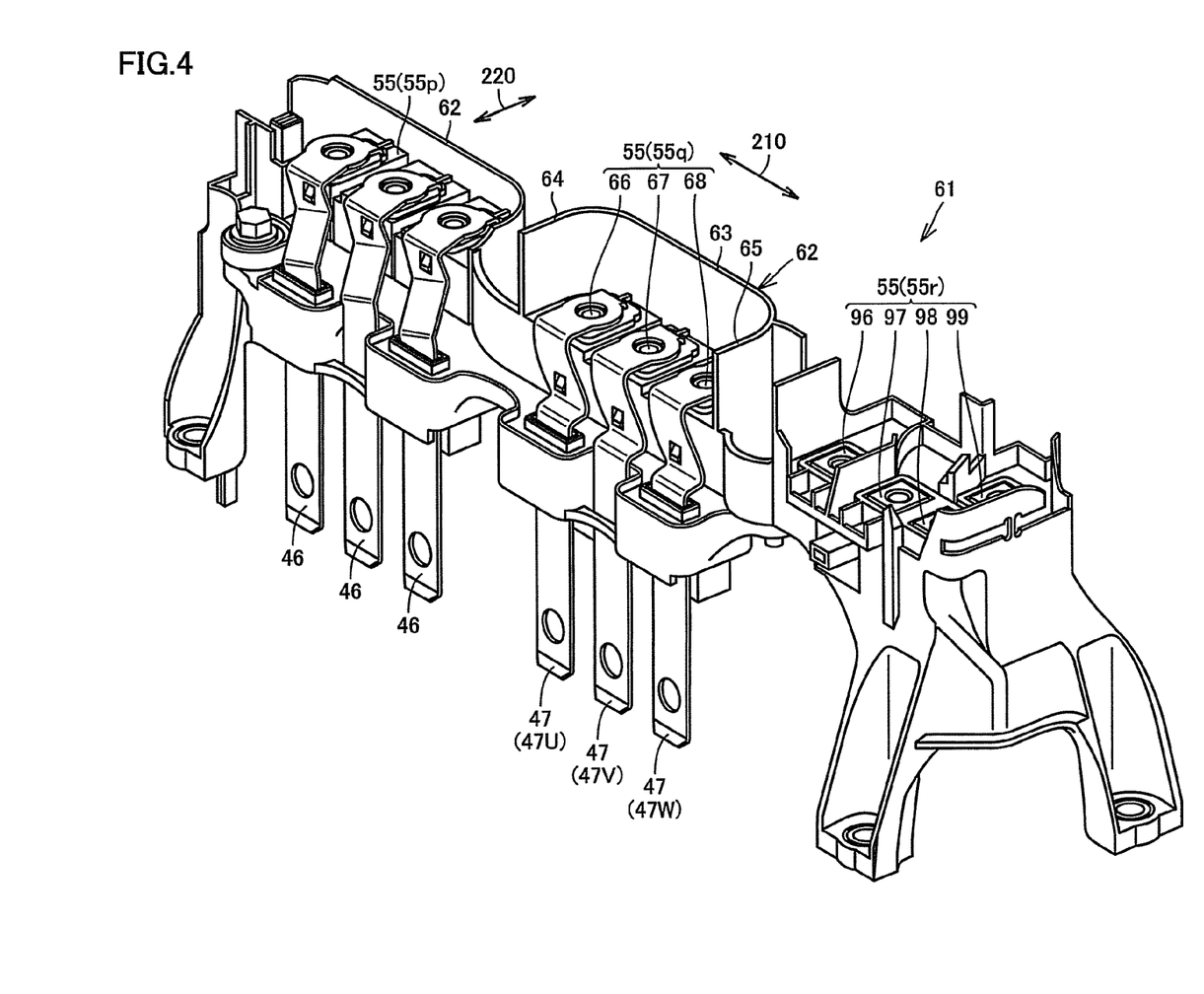
FIG. 4 is a perspective view of the terminal block shown in FIG. 3, viewed from the front side.
Figure 5:
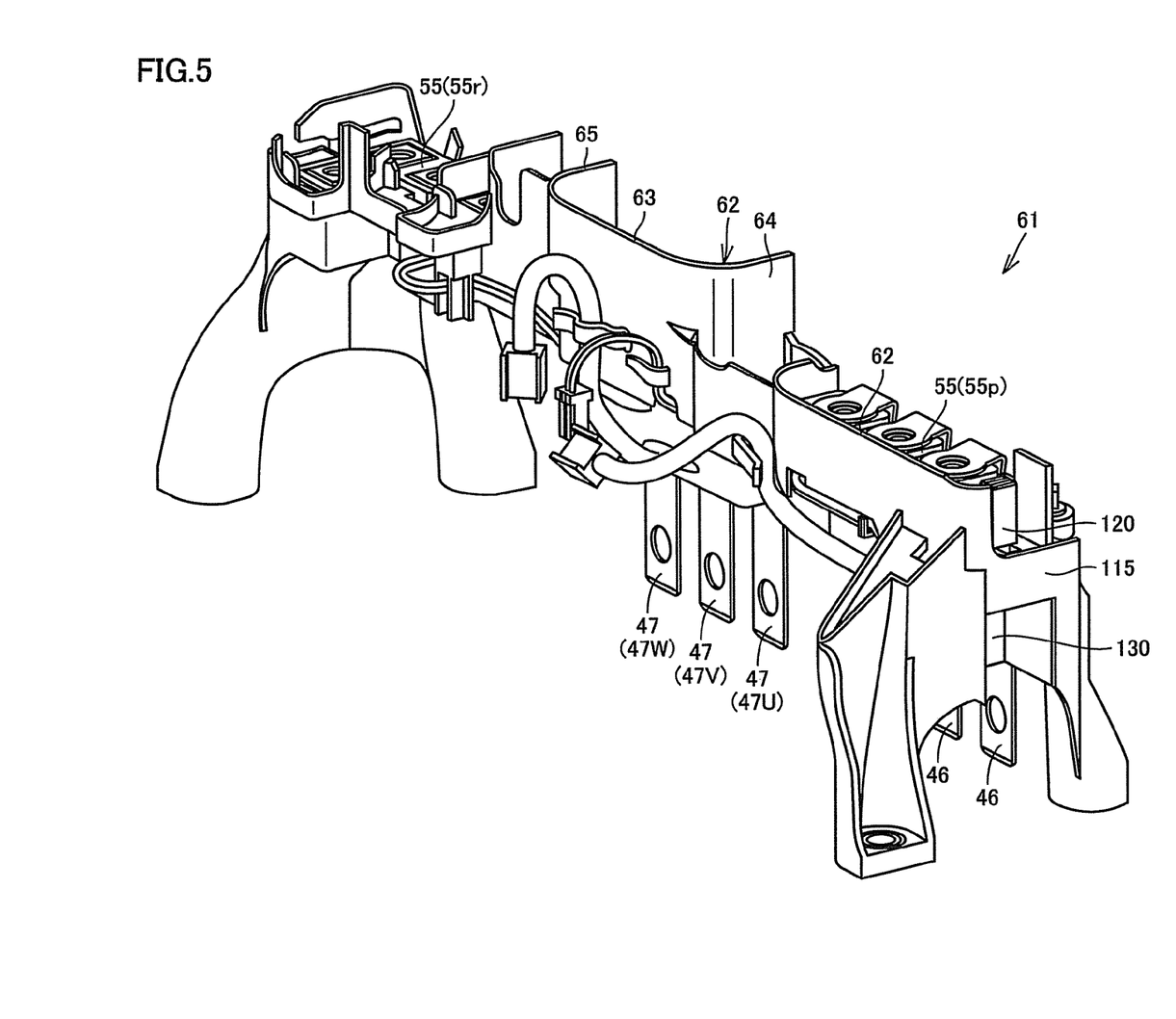
FIG. 5 is a perspective view of the terminal block shown in FIG. 3, viewed from the rear side.

FIG. 4 is a perspective view of the terminal block shown in FIG. 3, viewed from the front side. FIG. 5 is a perspective view of the terminal block shown in FIG. 3, viewed from the rear side. Referring to FIGS. 3-5, terminal block 61 is formed by resin. Terminal block 61 is made of an insulative material. Terminal block 61 is formed integrally by resin-molding.

Terminal block 61 includes a fastening section 55p, a fastening section 55q, and a fastening section 55r (hereinafter, referred to as fastening section 55 when discrimination therebetween is not particularly required) as constituent elements. Fastening sections 55p, 55q and 55r are provided in succession aligned in one direction indicated by arrow 210 in FIG. 4. Fastening sections 55p, 55q and 55r are formed at respective sites facing openings 53p, 53q and 53r, respectively.

In the assembly of a hybrid vehicle, power control unit 21, motor generators MG1 and MG2, and battery unit 40 are attached to the vehicle body, and electrical connection between these units is established by a cable. At this stage, a bus bar (for example, bus bar 86 shown in FIG. 7) is fastened to fastening section 55 by means of a bolt. Opening 53 is configured to allow a worker to insert a tool such as a wrench during such an assembly procedure to allow access to the bolt.

Power control unit 21 includes a plurality of bus bars 46, and a plurality of bus bars 47. Bus bar 46 and bus bar 47 are connected to fastening sections 55p and fastening section 55q, respectively. Fastening section 55p serves to establish electrical connection between motor generator MG1 and inverter 22, whereas fastening section 55q serves to establish electrical connection between motor generator MG2 and inverter 14 shown in FIG. 1.

The manner of fastening section 55q with bus bars 47 connected thereto will be described representative thereof. A U-phase fastening section 66, a V-phase fastening section 67 and a W-phase fastening section 68 provided corresponding to the U-phase, V-phase and W-phase, respectively, of motor generator MG2 constitute fastening section 55q. U-phase fastening sections 66, V-phase fastening section 67 and W-phase fastening section 68 are aligned in the direction indicated by arrow 210. Fastening section 55q has substantially a rectangular shape in plan view with one direction along which U-phase fastening section 66, V-phase fastening section 67 and W-phase fastening section 68 are aligned corresponding to the longitudinal direction and the direction orthogonal thereto (the direction indicated by arrow 220 in FIG. 4) corresponding to the shorter side direction.

Bus bars 47 include a U-phase bus bar 47U, a V-phase bus bar 47V and a W-phase bus bar 47W provided corresponding to the U-phase, V-phase and W-phase, respectively, of motor generator MG2. U-phase bus bar 47U, V-phase bus bar 47V and W-phase bus bar 47W each have one end connected to U-phase fastening section 66, V-phase fastening section 67 and W-phase fastening section 68, respectively, and the other end connected to U-phase arm 15, a V-phase arm 16 and a W-phase arm 17, respectively, of traction IPM 18 in FIG. 1.

Bus bar 47 extends from fastening section 55q in one direction along the direction indicated by arrow 220 in FIG. 4 (the direction orthogonal to the direction of arrow 210), and further bent vertically downwards.

Fastening section 55p and bus bars 46 are provided in a manner similar to that of fastening section 55q and bus bars 47.

Power control unit 21 further includes bus bars 56, 57 and 58. Bus bars 56, 57 and 58 are fastened to fastening section 55r.

A first fastening section 96, a second fastening section 97, a third fastening section 98 and a fourth fastening section 99 constitute fastening section 55r. Bus bar 56 is connected to first fastening section 96. Bus bar 57 is connected to second fastening section 97 and third fastening section 98. Bus bar 58 is connected to fourth fastening section 99. First fastening section 96 serves to electrically connect DC terminal 43 in FIG. 1 with smoothing capacitor 34 and reactor 32. Second fastening section 97 and third fastening section 98 serve to electrically connect DC terminal 44 in FIG. 1 with A/C compressor 35 and smoothing capacitor 34. Fourth fastening section 99 serves to electrically connect DC terminal 44 in FIG. 1 with A/C compressor 35 via a fuse 31.

As shown in FIG. 2, bus bars 56, 57 and 58 extend from fastening section 55r in a direction opposite to bus bars 46 and 47.

Figure 6:
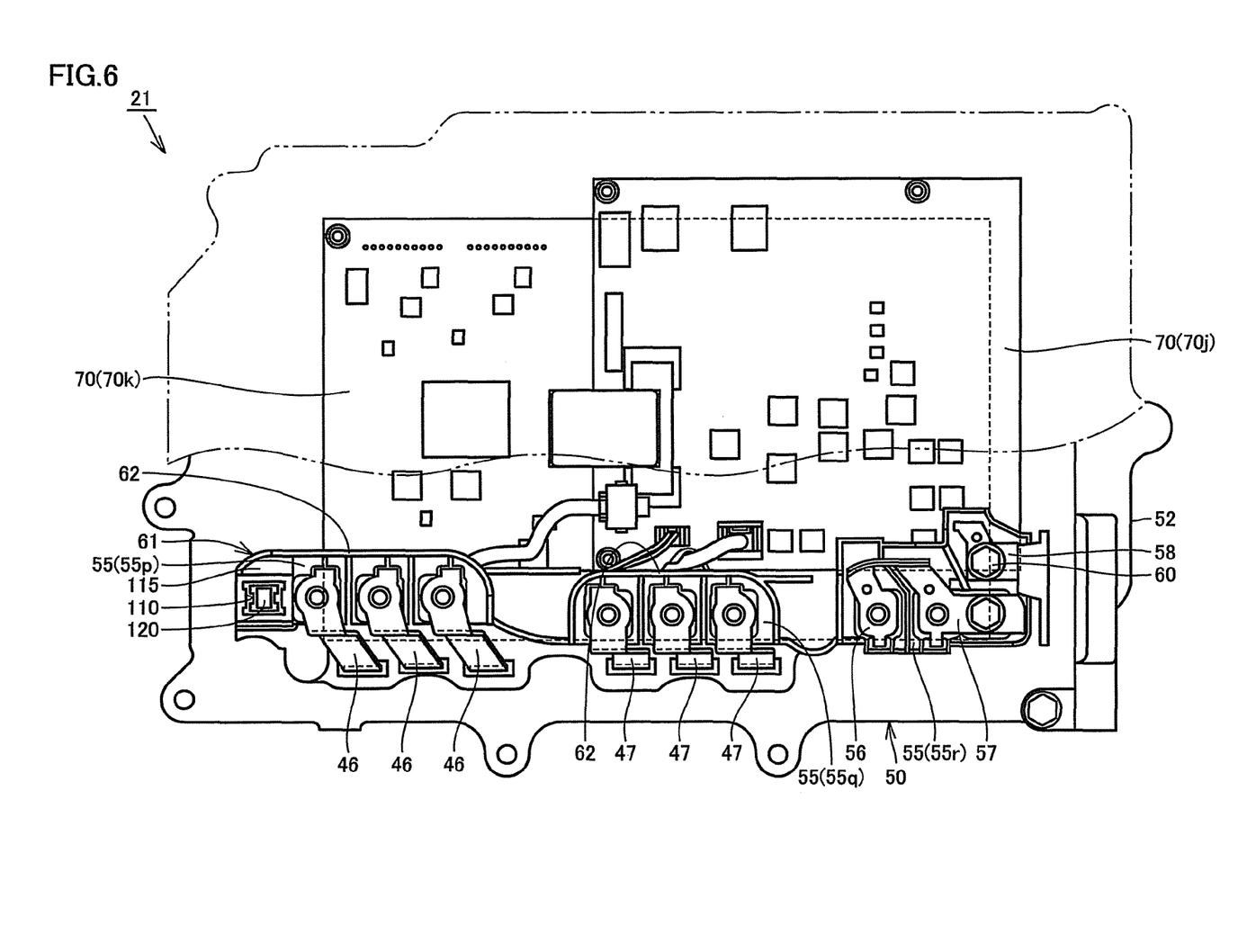
FIG. 6 is a top view representing a substrate stored in a PCU case shown in FIG. 3.
Figure 7:
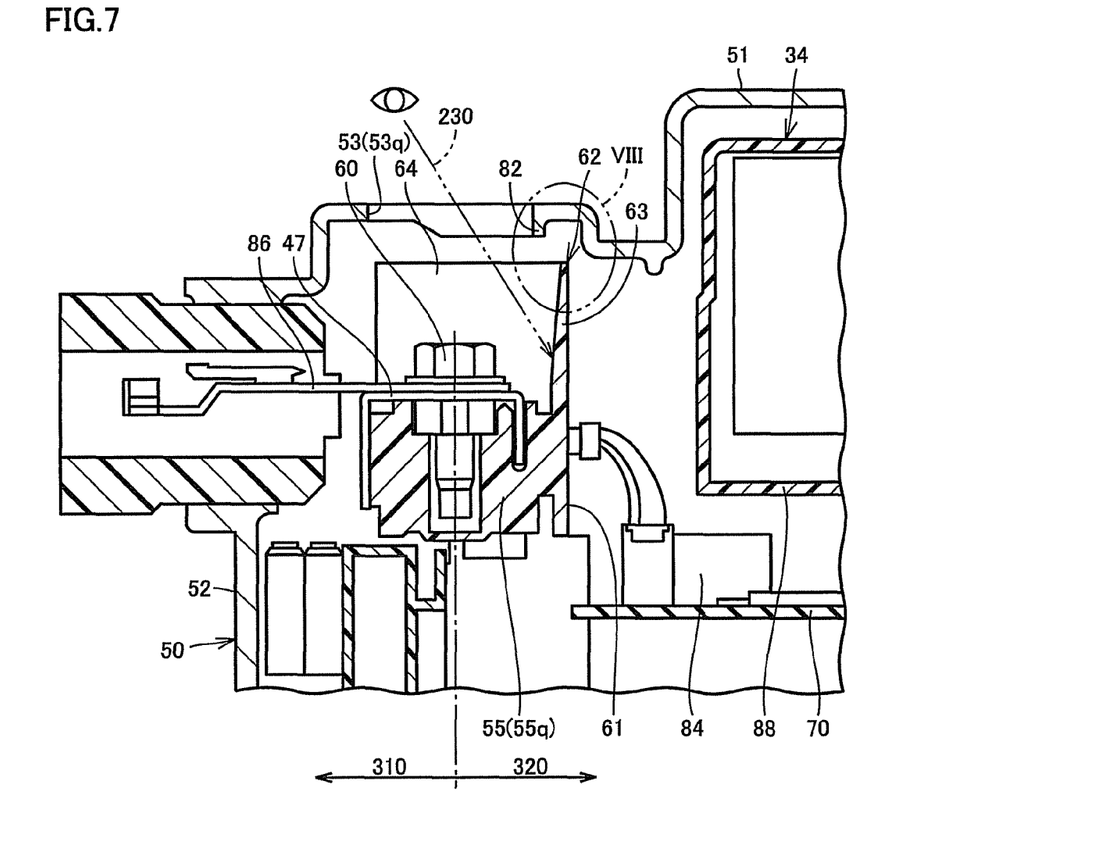
FIG. 7 is a sectional view of the power control unit taken along line VII-VII of FIG. 3.

FIG. 6 is a top view representing a substrate stored in the PCU case shown in FIG. 3. FIG. 7 is a sectional view of the power control unit taken along line VII-VII of FIG. 3.

Referring to FIGS. 6 and 7, power control unit 21 includes a substrate 70k and a substrate 70j (hereinafter, referred to as substrate 70 when discrimination therebetween is not particularly required). Substrate 70 is stored in PCU case 50. Substrate 70 is arranged adjacent to terminal block 61 inside PCU case 50. Substrate 70 is arranged to extend in plane, facing lid 51. Substrate 70 has a flat configuration of substantially a rectangle. Substrate 70 constitutes control device 30 shown in FIG. 1, having an electronic component 84 such as a resistor, diode, IC chip or transistor mounted on the surface.

Smoothing capacitor 34 is stored inside PCU case 50. Smoothing capacitor 34 is arranged between lid 51 and substrate 70. In the top view of FIG. 6, smoothing capacitor 34 is arranged in an overlapping position with substrate 70. In the top view of FIG. 6, smoothing capacitor 34 and terminal block 61 are provided side by side, having substrate 70 arranged thereunder.

Referring to FIG. 7, fastening section 55q has bus bar 86 fastened by means of a bolt 60. Bus bar 86 overlaps with bus bar 47 above fastening section 55q. Opening 53q is formed on a line of extension of the rotation axis of bolt 60.

Bus bar 86 extends from fastening section 55q in a direction opposite to substrate 70 and smoothing capacitor 34 relative to fastening section 55q. A cable extending from motor generator MG2 of FIG. 1 is connected to bus bar 86. When the space in PCU case 50 is divided into a first space 310 and a second space 320 corresponding to the left side and right side, respectively, about the rotation axis of bolt 60, bus bars 47 and 86 extend from fastening section 55q towards first space 310, whereas substrate 70 and smoothing capacitor 34 are arranged in second space 320.

The configuration of a wall 62 provided at terminal block 61 will be described hereinafter.

Referring to FIGS. 4 and 7, terminal block 61 in power control unit 21 of the present embodiment includes a wall 62. Wall 62 is formed integrally with terminal block 61. Wall 62 is formed by resin-molding integrally with fastening section 55q.

Wall 62 is located between opening 53q and substrate 70. Wall 62 is arranged to cross a straight line connecting opening 53q with substrate 70. Substrate 70 is arranged at the back side of wall 62 when viewed from opening 53q. Wall 62 extends from fastening section 55q towards lid 51 around the aperture of opening 53q. Wall 62 extends from fastening section 55q substantially upwards in the perpendicular direction. Wall 62 is arranged at the inner side of PCU case 50 relative to opening 53r. When opening 53r is viewed from a penetrating direction (perpendicular direction) of lid 51, wall 62 is located hidden at the back side of lid 51. There is a gap between the leading end of wall 62 and lid 51. Wall 62 is provided to block the line of sight 230 from outside PCU case 50 towards substrate 70 through opening 53.

A back section 63 and side sections 64 and 65 constitute wall 62. Back section 63 is located at the side opposite to the side where bus bars 47 and 86 extend. Back section 63 is arranged in second space 320. Side sections 64 and 65 bend from both ends of back section 63 to extend towards the extending direction of bus bars 47 and 86. When viewed from the inserting direction of bolt 60 relative to fastening section 55q, back section 63 and side sections 64 and 65 are arranged corresponding to three of the four sides around fastening section 55q, excluding the side from which bus bars 47 and 86 extend.

Although the manner of wall 62 provided at fastening section 55q has been described in the foregoing, wall 62 is also provided at fastening section 55p in a similar manner.

During the transportation of power control unit 21 to the assembly plant of the hybrid vehicle or during assembly of power control unit 21 to the vehicle body, one concern is the intrusion of a foreign object, whether fluid or solid, into PCU case 50 through opening 53. Another concern is that, if the bolt is inserted in a slanted manner at the time of fastening the bus bar to terminal block 61, fastening section 55 may have to be threaded again, leading to the possibility of a foreign object that was generated at this stage entering PCU case 50. An intrusion of such a foreign object towards substrate 70 will degrade the reliability of substrate 70 qualified as a control device.

Measures to overcome such concerns is to provide a cover for substrate 70, coating the surface of substrate 70, eliminating the gap around terminal block 61 by means of a gasket or sponge, and the like. However, the provision of a cover for substrate 70 may require the space for attaching the cover to prevent reducing the size of the power control unit, or may require an additional component to increase the fabrication cost. In the case where coating is applied to substrate 70, there is a possibility of a small hole being formed in the coating to allow an intrusion of a foreign object. In the event of the phenomenon of a foreign object sinking into the coating, the insulation between substrate 70 and the foreign object cannot be ensured. Furthermore, the necessity of an additional coating step will increase the fabrication cost. In the case where the gap around terminal block 61 is to be eliminated by means of a gasket or sponge, extra space is required for sealing thereof, disallowing downsizing of power control unit 21, and/or increasing the fabrication cost due to the additional sealing member.

In view of the foregoing, wall 62 is provided at power control unit 21 of the present embodiment to block the path from openings 53p and 53q towards substrate 70. By such a configuration, any foreign object entering PCU case 50 through openings 53p and 53q can be prevented from being directed towards substrate 70. Since wall 62 is formed integrally with terminal block 61, power control unit 21 can be reduced in cost and size.

Particularly, in the present embodiment, three of the four sides around fastening section 55p and fastening section 55q are surrounded by wall 62, excluding the side corresponding to the extending direction of the bus bar. Therefore, even if a foreign object enters through openings 53p and 53q onto fastening sections 55p and 55q, or a bolt falls off from fastening sections 55p and 55q inadvertently during the fastening operation, the event of a foreign object or bolt traveling directly towards substrate 70 can be prevented. Even if such a foreign object or bolt enters first space 310 from the region where wall 62 is not present, arrival of the foreign object or bolt at substrate 70 can be prevented by virtue of substrate 70 being arranged in the second space.

Since substrate 70 takes a flat configuration spreading in plane, substrate 70 constitutes a large area in plan view of power control unit 21. It is to be noted that terminal block 61 is arranged in the proximity of the side face of PCU case 50 for connecting an externally applied cable to terminal block 61. Therefore, if substrate 70 has to be separated greatly apart from terminal block 61 in such a case, the area of PCU case 50 must be increased in plan view of power control unit 21. In the present embodiment, substrate 70 can be arranged in the proximity of terminal block 61 by overcoming the concern of the intrusion of a foreign object towards substrate 70. As a result, power control unit 21 can be effectively reduced in size.

Figure 8:
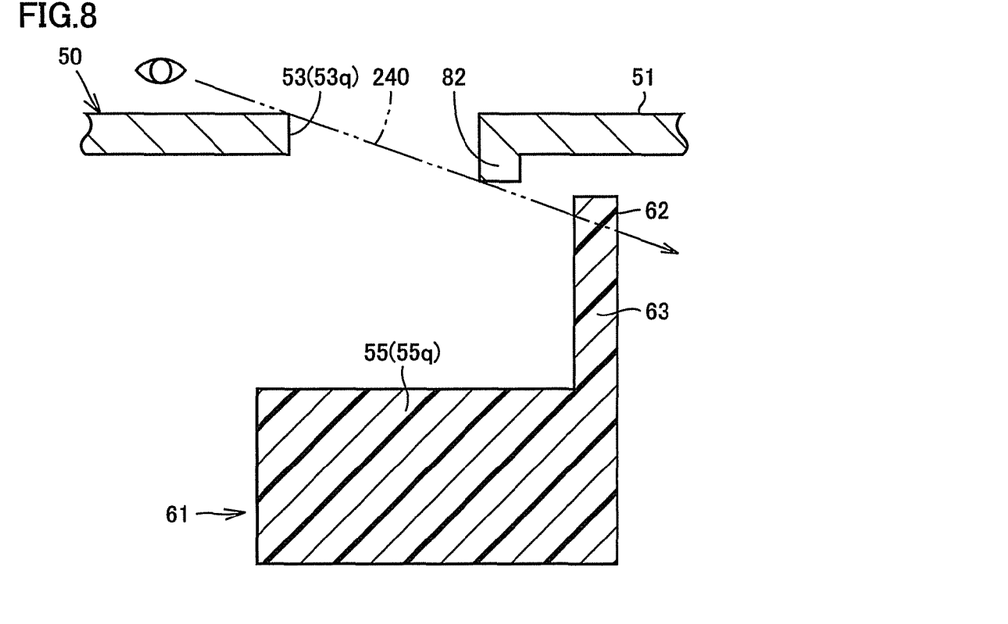
FIG. 8 is a sectional view representing the range surrounded by the chain line with two dots VIII of FIG. 7 in an enlarged manner.

FIG. 8 is a sectional view representing the range surrounded by the chain line with two dots VIII of FIG. 7 in an enlarged manner. Referring to FIG. 8, PCU case 50 includes a rib-like section 82. Rib-like section 82 is formed at lid 51. Rib-like section 82 protrudes from the inner edge of lid 51 defining opening 53q, inward of PCU case 50. Rib-like section 82 is formed trailing downwards perpendicularly from the inner edge of lid 51 defining opening 53q. Rib-like section 82 is arranged between opening 53q and substrate 70. Rib-like section 82 is formed at the inner side of PCU case 50 relative to opening 53r, located closer to opening 53r than wall 62.

In power control unit 21 of the present embodiment, wall 62 is provided so as to block the line of sight 240 from the outer side of PCU case 50 towards substrate 70 through opening 53q and over rib-like section 82.

Since PCU case 50 is substantially a sealed case body in which no air flow occurs, any foreign object entering PCU case 50 through opening 53q will drop down perpendicularly. By virtue of wall 62 provided to block the line of sight 240 over rib-like section 82, the travel of a foreign object towards substrate 70 can be prevented more reliably.

Figure 9:
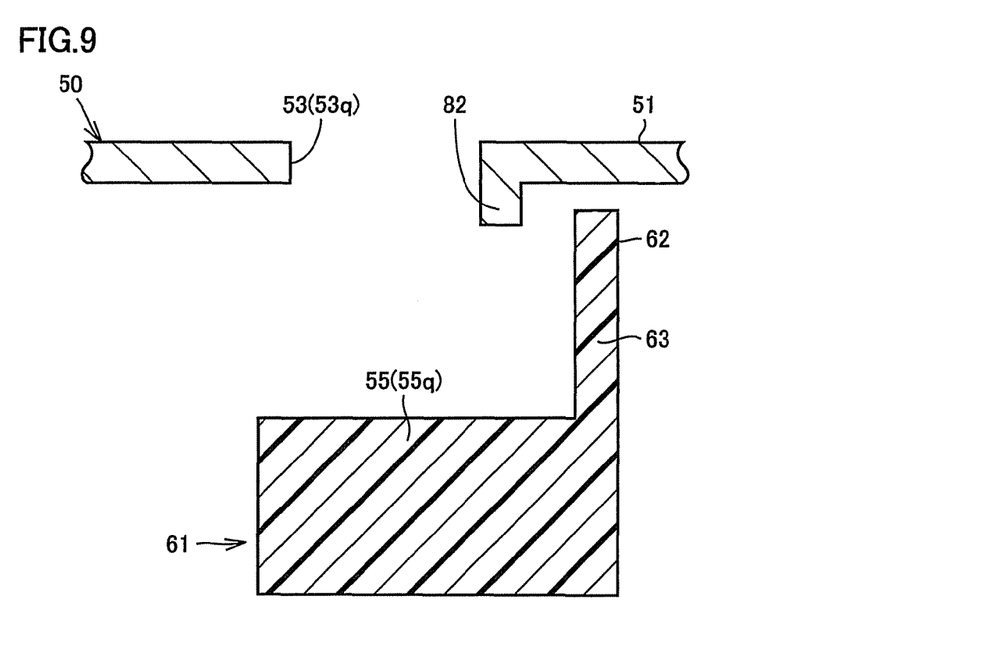
FIG. 9 is a sectional view representing a first modification of the power control unit shown in FIG. 8.

FIG. 9 is a sectional view representing a first modification of the power control unit shown in FIG. 8. Referring to FIG. 9, wall 62 extends as far as to a position overlapping with rib-like section 82 in the height direction (perpendicular direction) in the present modification. Such a configuration allows the travel of a foreign object towards substrate 70 to be prevented further reliably.

Figure 10:
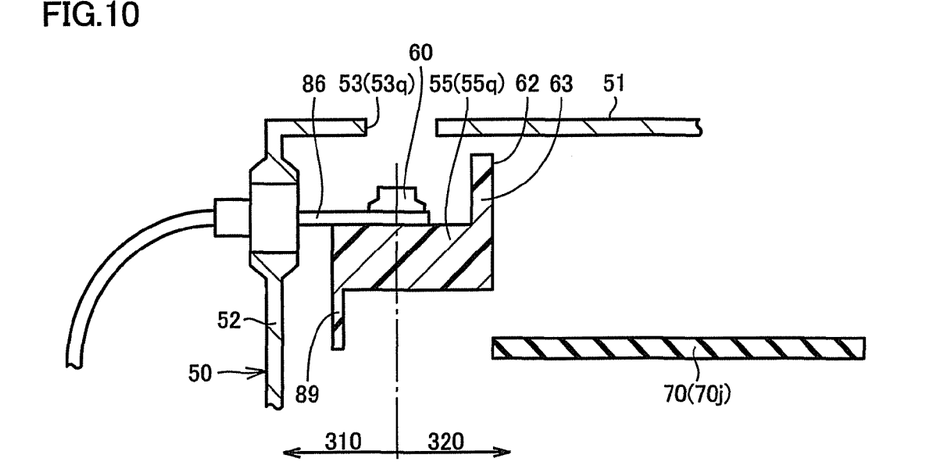
FIG. 10 is a sectional view representing a second modification of the power control unit shown in FIG. 8

FIG. 10 is a sectional view representing a second modification of the power control unit shown in FIG. 8. Referring to FIG. 10, terminal block 61 further includes a wall 89 that is a second wall, in addition to wall 62 in the present modification. Wall 89 extends from fastening section 55q in a direction opposite to wall 62 (perpendicularly downwards). Wall 89 is deviated from a position between terminal block 61 and substrate 70. In other words, substrate 70 is not located on the line of extension of wall 89 extending from fastening section 55q. Wall 89 is provided at first space 310. Wall 89 extends in the height direction (perpendicular direction) such that at least a portion of wall 89 overlaps with substrate 70.

By such a configuration, any foreign object entering PCU case 50 can be prevented from moving around fastening section 55q from the side of first space 310 towards substrate 70 by virtue of wall 89.

Although the manner of wall 62 and wall 89 provided at fastening section 55q has been described with reference to FIGS. 8-10, wall 62 and wall 89 are also provided at fastening section 55p in a similar manner.

Figure 11:
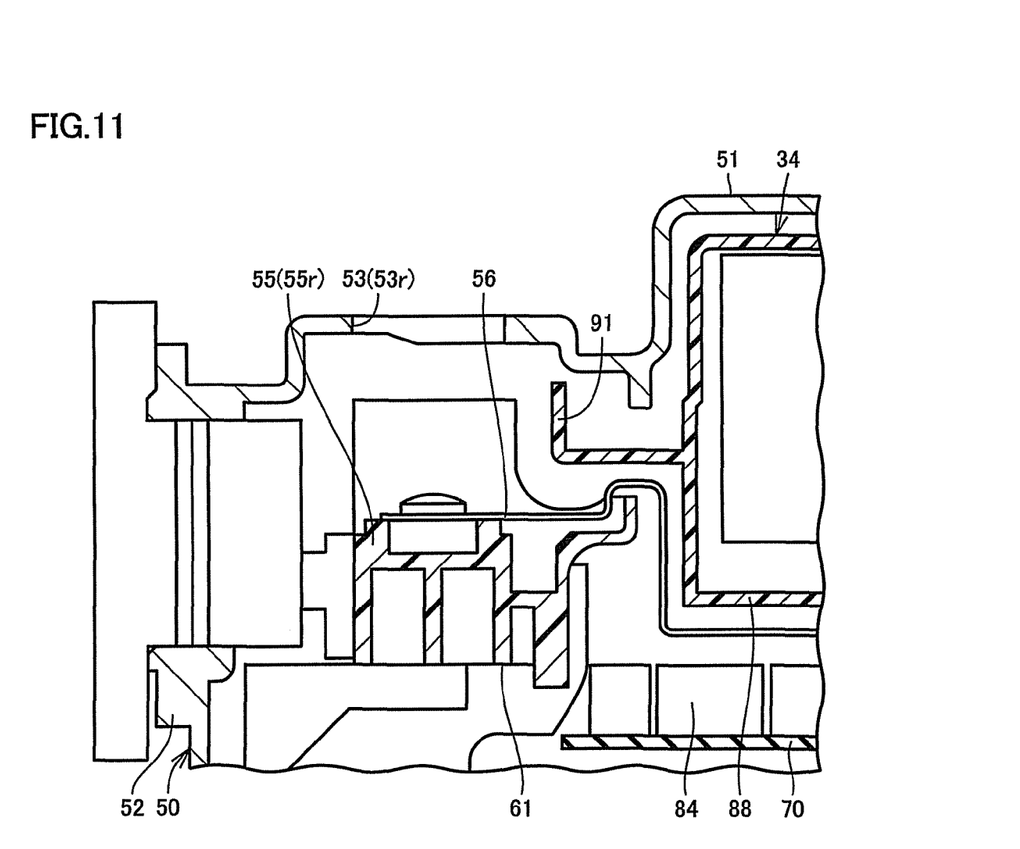
FIG. 11 is a sectional view representing a power control unit taken along line XI-XI of FIG. 3.

FIG. 11 is a sectional view of the power control unit taken along line XI-XI in FIG. 3. Referring to FIG. 11, smoothing capacitor 34 includes a wall 91 in power control unit 21 of the present embodiment. Wall 91 is provided integrally with smoothing capacitor 34 to which one ends of bus bars 56 and 57 are connected. Wall 91 is arranged between opening 53r and substrate 70. Wall 91 extends from a capacitor case 88 constituting the outer covering of smoothing capacitor 34 towards terminal block 61, and then bends towards lid 51 around the aperture of opening 53r. Wall 91 is located between bus bars 56 and 57 (also refer to FIG. 3) and lid 51. Wall 91 is arranged facing bus bars 56 and 57.

Since bus bars 56 and 57 extend towards the side of substrate 70 at fastening section 55r, a wall cannot be formed at fastening section 55r. In the present embodiment, an intrusion of a foreign object towards substrate 70 through opening 53r is prevented by wall 91 extending from capacitor case 88 towards lid 51 around the aperture of opening 53r. Since wall 91 is provided integrally with an existing smoothing capacitor 34 as a component that constitutes power control unit 21, reduction in cost and size of power control unit 21 can be achieved likewise with the previous case.

The power control unit constituent component for providing wall 91 is not limited to smoothing capacitor 34. For example, if the component connected to bus bars 56 and 57 is boosting IPM 13, wall 91 may be formed integrally with boosting IPM 13. In the case where there is a heat source in PCU case 50 and wall 91 is arranged so as to block the heat source from substrate 70, wall 91 also serves to suppress heat transfer from the heat source to substrate 70.

The configuration of a power control unit according to the first embodiment of the present invention is summarized in the following. Power control unit 21 of the present embodiment is mounted on a hybrid automobile that is a vehicle, and controls the electric power for vehicle-running. Power control unit 21 includes a PCU case 50 as the case body, having a lid 51 as the top, and an opening 53 formed at lid 51, a terminal block 61 stored in PCU case 50 and arranged facing opening 53, and a substrate 70 stored in PCU case 50, and on which an electronic component 84 is mounted. Terminal block 61 includes a wall 62 as the first wall. Wall 62 is arranged between substrate 70 and opening 53, and extends towards lid 51 around the aperture of opening 53.

By power control unit 21 according to the first embodiment of the present invention configured as set forth above, an intrusion of a foreign object towards substrate 70 can be prevented by virtue of wall 62. Furthermore, by providing wall 62 at terminal block 61, a coating or attachment of a cover for the substrate, provision of a sealing member, and the like are dispensable. Thus, reduction in the size and cost of power control unit 21 can be realized.

Second Embodiment

In the present embodiment, a configuration of terminal block 61 provided in power control unit 21 of the first embodiment will be described further.

Figure 12:
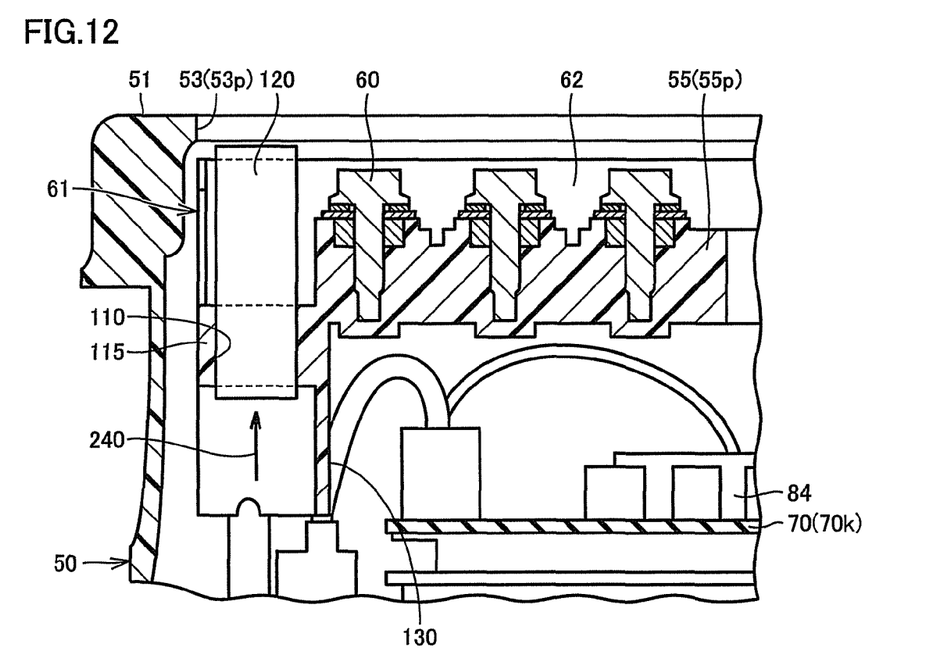
FIG. 12 is a sectional view representing a power control unit taken along line XII-XII of FIG. 3.

FIG. 12 is a sectional view of a power control unit taken along line XII-XII in FIG. 3. Referring to FIGS. 3, 5 and 12, power control unit 21 includes an interlock connector 120. Interlock connector 120 is attached to terminal block 61. Another cover is further attached so as to cover lid 51 with power control unit 21 mounted on the vehicle body. The attachment of the cover is confirmed by the insertion of the pin supported at the cover into interlock connector 120.

A connector retain hole 110 is formed at terminal block 61. Terminal block 61 includes a connector attachment boss 115. Connector attachment boss 115 is provided aligned with fastening section 55p. Connector attachment boss 115 is located at an end of terminal block 61 in the direction indicated by arrow 210 in FIG. 4. Connector retain hole 110 is formed in connector attachment boss 115.

Connector retain hole 110 is located at a position facing opening 53p. Connector retain hole 110 pierces connector attachment boss 115 in the vertical direction to reach the interior of PCU case 50. Interlock connector 120 is attached to connector attachment boss 115 by being inserted into connector retain hole 110 from the direction indicated by arrow 240 in FIG. 12.

Power control unit 21 includes a wall 130. In the present embodiment, wall 130 is formed integrally with terminal block 61. Wall 130 is resin-molded integrally with fastening section 55p.

Substrate 70 (substrate 70k) is arranged at a side opposite to lid 51 relative to terminal block 61 in the height direction. In other words, lid 51, terminal block 61 and substrate 70 are arranged aligned downwards from the top in the cited order. Wall 130 is arranged between connector retain hole 110 and substrate 70 (substrate 70k). Wall 130 is arranged to cross a straight line connecting connector retain hole 110 and substrate 70. Substrate 70 is arranged at the back side of wall 130 when viewed from connector retain hole 110. Wall 130 extends from connector attachment boss 115 downwards in the perpendicular direction. Wall 130 extends from connector attachment boss 115 in the direction of inserting interlock connector 120 into connector retain hole 110. By such a configuration, insertion of interlock connector 120 into connector retain hole 110 can be implemented readily without interference of interlock connector 120 and wall 130 during the insertion work.

Substrate 70 is arranged deviated from the position facing the aperture of connector retain hole 110 in connector attachment boss 115. Wall 130 extends from connector attachment boss 115 as far as to the proximity of substrate 70 in the height direction. Wall 130 may extend from connector attachment boss 115 to a position overlapping with substrate 70 in the height direction.

When viewed from the direction of inserting interlock connector 120 into connector retain hole 110, wall 130 is arranged at three of the four sides around connector attachment boss 115, excluding the side opposite to the side where substrate 70 is arranged relative to connector retain hole 110.

Wall 130 may be provided integrally with another power control unit component arranged adjacent to substrate 70, instead of integrally with terminal block 61.

During the transportation of power control unit 21 to the assembly plant of the hybrid vehicle or during mounting of power control unit 21 to the vehicle body, one concern is a foreign object entering PCU case 50 through opening 53p and connector retain hole 110 towards substrate 70. In view of this concern, wall 130 is provided at power control unit 21 of the present embodiment so as to block the path between connector retain hole 110 and substrate 70. By such a configuration, the travel of a foreign object entering PCU case 50 through connector retain hole 110 towards substrate 70 can be prevented. Since wall 130 is provided integrally with terminal block 61, reduction in the cost and size of power control unit 21 can be achieved.

The configuration of a power control unit according to the second embodiment of the present invention is summarized in the following. Power control unit 21 of the present embodiment is mounted on a vehicle, and controls the electric power for vehicle-running. Power control unit 21 includes a PCU case 50 as the case body, having a lid 51 as the top and an opening 53 formed at lid 51, a terminal block 61 having a connector retain hole 110 formed to retain an interlock connector 120 that is a connector, and arranged facing opening 53 at PCU case 50, and a substrate 70 stored in PCU case 50 and on which an electronic component 84 is mounted. Substrate 70 is arranged at a side opposite to lid 51 relative to terminal block 61, and deviated from the site opposite to the aperture of connector retain hole 110. Power control unit 21 further includes a wall HO as a wall member provided integrally with terminal block 61 as a power control unit constituent component, and disposed between substrate 70 and connector retain hole 110.

By power control unit 21 according to the second embodiment of the present invention configured as set forth above, an intrusion of a foreign object towards substrate 70 can be prevented by the provision of wall 130. Furthermore, by providing wall 130 at terminal block 61, a coating or attachment of a cover for the substrate, provision of a sealing member, and the like are dispensable. Thus, reduction in the size and cost of power control unit 21 can be realized.

The present invention can also be applied to a power control unit incorporated in a fuel cell hybrid vehicle (FCHV) having a fuel cell and a secondary battery as the power source or an electric vehicle (EV). The hybrid vehicle of the present embodiment drives the internal combustion engine at the optimum operating point of fuel economy whereas the fuel cell hybrid vehicle drives the fuel cell at the optimum operating point of power generation efficiency. The usage of the secondary battery is basically the same in either hybrid vehicle.

INDUSTRIAL APPLICABILITY

The present invention is applied to a power control unit incorporated mainly in a vehicle such as a hybrid vehicle or an electric vehicle for controlling the electric power for vehicle-running.

REFERENCE SIGNS LIST 10 voltage sensor; 11, 24, 25 current sensor; 12 boost converter; 14, 22 inverter; 15 U-phase arm; 16 V-phase arm; 17 W-phase arm; 20 vehicle driving device; 21 power control unit; 26 power split mechanism; 30 control device; 31 fuse; 32 reactor; 33, 34 smoothing capacitor; 35 A/C compressor; 40 battery unit; 41, 42 terminal; 43, 44 DC terminal; 46, 47, 56, 57, 58, 86 bus bar; 47U U-phase bus bar; 47V V-phase bus bar; 47W W-phase bus bar; 50 PCU case; 51 lid; 52 case main body; 53, 53*p*, 53*q*, 53*r* opening; 55, 55*p*, 55*q*, 55*r* fastening section; 60 bolt; 61 terminal block; 62, 89, 91 wall; 63 back section; 64, 65 side section; 66 U-phase fastening section; 67 V-phase fastening section; 68 W-phase fastening section; 70, 70*j*, 70*k* substrate; 82 rib-like section; 84 electronic component; 88 capacitor case; 96 first fastening section; 97 second fastening section; 98 third fastening section; 99 fourth fastening section; 110 connector retain hole; 115 connector attachment boss; 120 interlock connector; 130 wall; 310 first space; 320 second space.

The invention claimed is:

1. A power control unit mounted on a vehicle for controlling electric power for vehicle-running, comprising:

a case body including a top where an opening is formed, a terminal block including a fastening section to which a bus bar is connected and a connector attachment boss provided adjacent to said fastening section and having a connector retain hole formed, and arranged at said case body facing said opening, a connector attached to said connector attachment boss by being inserted into said connector retain hole from one direction, a substrate stored in said case body, and on which an electronic component is mounted, said substrate arranged at a side opposite to said top relative to said terminal block, and deviated from a position facing an aperture of said connector retain hole in the inserting direction of said connector into said connector retain hole, a wall member provided integrally with a power control unit constituent component, and arranged between said substrate and said connector retain hole, said wall member provided integrally with said terminal block, and said wall member extending from said connector attachment boss along the inserting direction of the connector.

2. The power control unit according to claim 1, wherein said wall member extends from said connector attachment boss as far as to a position overlapping with said substrate in a height direction.

* * * * *